United States Patent
Suzuki

[11] Patent Number: 5,905,569
[45] Date of Patent: May 18, 1999

[54] ILLUMINANCE MEASURING METHOD, AN EXPOSURE APPARATUS USING THE METHOD, AND A DEVICE MANUFACTURING METHOD

[75] Inventor: Akiyoshi Suzuki, Tokyo, Japan

[73] Assignee: Canon Kabushiki Kaisha, Tokyo, Japan

[21] Appl. No.: 08/824,797

[22] Filed: Mar. 26, 1997

[30] Foreign Application Priority Data

Mar. 29, 1996 [JP] Japan ................................ 8-076523

[51] Int. Cl.$^6$ .......................................................... G01J 1/00
[52] U.S. Cl. ............................................................ 356/121
[58] Field of Search ................................... 356/399–401, 356/121, 122, 222, 226, 445–448; 362/268, 263, 259; 355/67, 68, 69, 71, 53, 43; 359/601; 250/559.3, 548, 492.21–492.24

[56] References Cited

U.S. PATENT DOCUMENTS

| | | |
|---|---|---|
| 4,575,250 | 3/1986 | Suzuki . |
| 4,641,035 | 2/1987 | Suzuki et al. . |
| 4,717,242 | 1/1988 | Echizen et al. . |
| 4,780,615 | 10/1988 | Suzuki . |
| 4,798,450 | 1/1989 | Suzuki . |
| 4,799,791 | 1/1989 | Echizen et al. . |
| 4,871,257 | 10/1989 | Suzuki et al. . |
| 4,883,359 | 11/1989 | Ina et al. . |
| 4,886,975 | 12/1989 | Murakami et al. . |
| 4,894,611 | 1/1990 | Shimoda et al. . |
| 5,124,562 | 6/1992 | Kawashima et al. . |
| 5,133,603 | 7/1992 | Suzuki et al. . |
| 5,268,744 | 12/1993 | Mori et al. . |
| 5,309,197 | 5/1994 | Mori et al. . |
| 5,684,595 | 11/1997 | Kato et al. . |

FOREIGN PATENT DOCUMENTS 5-062883 3/1993 Japan .

*Primary Examiner*—K P Hantis
*Attorney, Agent, or Firm*—Fitzpatrick, Cella, Harper & Scinto

[57] ABSTRACT

An illuminance measuring method and apparatus measures the illuminance on a wafer in an exposure apparatus for projecting a pattern formed on a mask onto a wafer. The illuminance of the mask causes the formation of ghost light on the mask. The apparatus and method use a first technique to measure the illuminance on the wafer while a mask used for actual exposure is mounted in the exposure apparatus and the mask is illuminated. The apparatus and method also use a second technique, different form the first technique, to measure the illuminance on the wafer while the mask used for actual exposure is mounted in the exposure apparatus and the mask is illuminated. The apparatus and method also find the distribution of the ghost light caused by the mask, based on the illuminance measured by these two techniques.

39 Claims, 10 Drawing Sheets

ILLUMINANCE MEASURING METHOD, AN EXPOSURE APPARATUS USING THE METHOD, AND A DEVICE MANUFACTURING METHOD

BACKGROUND OF THE INVENTION

1. Field of the Invention

The present invention relates to an illuminance measuring method, an exposure apparatus using the method, and a device manufacturing method.

2. Description of the Related Art

With the recent remarkable progress in the fine processing technology for manufacturing semiconductor devices, it is demanded that an exposure apparatus be capable of forming a precise line which has a width identical to the wavelength of the exposure light used in the exposure apparatus. When the line is being formed, the presence of any illuminance irregularity in the illumination light (exposure light) on a reticle (mask) hinders a circuit pattern from being accurately projected onto a wafer.

To avoid this problem, conventionally, an illuminance distribution on the wafer is measured with the reticle removed from the optical path of the illumination light, and the illumination (exposure) system is adjusted so that an error measured in the illuminance distribution is set to be ±1% or less, thereby uniformity of illuminance on the reticle can be maintained.

However, even when uniformity of the illuminance on the reticle is maintained, in approximation with the reticle being removed from the optical path, a phenomenon called a "ghost" image occurs during actual exposure, because illumination light reflected by the reticle returns to the illumination system, and is further reflected inside of the illumination system, back to the reticle, again. To control the line width to a precision on the order of ±5% or less, it is necessary to control such a ghost image phenomenon, which has otherwise been ignored.

As a method for measuring such a ghost image, a method using a special reticle (e.g., a test reticle) as disclosed in, for example, Japanese Unexamined Patent Publication No. 5-62883, is known.

However, the above method is suitable only for presuming the amount of the ghost image that occurs, and disadvantageously, requires a significant measuring time due to its complicated procedure. In addition, the illuminance distribution on the reticle, caused by the ghost image phenomenon, varies depending upon the pattern density of the reticle or the shape of the reticle. This causes an inconvenience of preparing a test reticle for each pattern.

SUMMARY OF THE INVENTION

Accordingly, it is an object of the present invention to provide an apparatus and method for directly measuring the distribution of a ghost image or ghost light caused by the illumination of a reticle which is used for an actual exposure.

It is another object of the present invention to solve the problems of conventional exposure apparatuses which generate ghost light.

According to one aspect, the present invention which achieves these objects relates to an illuminance measuring method for measuring the illuminance on a wafer in an exposure apparatus for projecting a pattern formed on a mask onto the wafer. The illuminance of the mask causes the formation of ghost light on the mask. The method comprises the step of using a first technique to measure the illuminance on the wafer while the mask is mounted in the exposure apparatus and the mask is illuminated. The method also comprises the step of using a second technique, different from the first technique, to measure the illuminance on the wafer while the mask is mounted in the exposure apparatus and the mask is illuminated. The method further comprises the step of finding the distribution of the ghost light, based on the illuminance measured by the first and second techniques.

According to another aspect, the present invention which achieves these objectives relates to an illuminance measuring method for measuring the illuminance on a wafer in an exposure apparatus for projecting a pattern formed on a mask onto the wafer. The illuminance of the mask causes the formation of ghost light on the mask. The method comprises the step of measuring the illuminance on the wafer while the mask is mounted in the exposure apparatus when the measured illuminance on the wafer includes the ghost light in a first measuring step. The method also comprises the step of measuring the illuminance on the wafer while the mask is mounted in the exposure apparatus when the measured illuminance on the wafer does not include the ghost light in a second measuring step. The method further comprises the step o finding the distribution of the ghost light mask by comparing the illuminance measured by the first and second measuring steps.

According to still another aspect, the present invention achieves these objectives relates to an exposure apparatus including a mask stage, a wafer stage, illuminance measuring means, and operation means. The mask stage supports a mask having a pattern formed thereon. The wafer stage supports a wafer onto which the pattern formed on the mask is projected. The illuminance measuring means measures the illuminance on the wafer. The operation means determines the distribution of ghost light caused by the mask when the mask is illuminated in the exposure apparatus. The illuminance measuring means uses a plurality of techniques to measure the illumination on the wafer while the mask is mounted on the mask stage. The operation means determines the distribution of the ghost light based on the illuminance measured by the plurality of techniques by the illuminance measuring means.

According to still another aspect, the present invention which achieves these objectives relates to an exposure apparatus including a mask stage, a wafer stage, illuminance measuring means, and operation means. The mask stage supports a mask having a pattern formed thereon. The wafer stage supports a wafer onto which the pattern formed on the mask is projected. The illuminance measuring means measures the illuminance on the wafer. The operation means determines the distribution of the ghost light caused by the mask when the mask is illuminated in the exposure apparatus. The illuminance measuring means measures the illuminance on the wafer when the illuminance measured on the wafer includes ghost light and when the illuminance measured on the wafer does not include the ghost light while a mask used for the actual exposure is mounted in the exposure apparatus. The operation means determines the distribution of the ghost light by comparing the measured illuminance when the measured illuminance on the wafer includes and does not include the ghost light.

According to still another aspect, the present invention which achieves these objectives relates to a device manufacturing method for manufacturing devices using an exposure apparatus for projecting a pattern formed on a mask onto a wafer. The illumination of the mask causes the formation of the ghost light on the mask. The device manufacturing method comprises the steps of using first and second illuminance measuring techniques, and determining and projecting steps. The first illuminance measuring technique uses a first technique to measure the illuminance on the wafer while the mask is mounted in the exposure apparatus. The second illuminance measuring technique uses a second technique, different from the first technique, to measure the illuminance on the wafer while the mask is mounted in the exposure apparatus. The determining step determines the distribution of the ghost light, based on the illuminance measured by the first and second techniques, and compensates for the ghost light using the distribution found in the determining step to uniformly illuminate the mask. The projecting step projects the pattern onto the wafer using the exposure apparatus to manufacture a device using the exposure apparatus.

According to still another aspect, the present invention relates to a device manufacturing method for manufacturing devices using an exposure apparatus for projecting a pattern formed on a mask onto a wafer. The illuminance of the mask causes the formation of ghost light on the mask. The method comprises two measuring steps, a determining step, and a projecting step. The first measuring step measures the illuminance on the wafer while the mask is mounted in the exposure apparatus when the measured illuminance on the wafer includes ghost light. The second measuring step measures the illuminance on the wafer while the mask is mounted in the exposure apparatus when the measured illuminance on the wafer does not include the ghost light. The determining step determines the distribution of the ghost light by comparing the illuminance measured by the first and second measuring steps, and compensates for the ghost light determined in the determining step to uniformly illuminate the mask. The projecting step projects the pattern from the mask onto the wafer using the exposure apparatus to manufacture a device using the exposure apparatus.

These and other objects, advantages, and features of the present invention will become apparent upon a review of the following detailed description of the preferred embodiments when taken in conjunction with the attached drawings.

DESCRIPTION OF THE PREFERRED EMBODIMENTS

Figure 1:
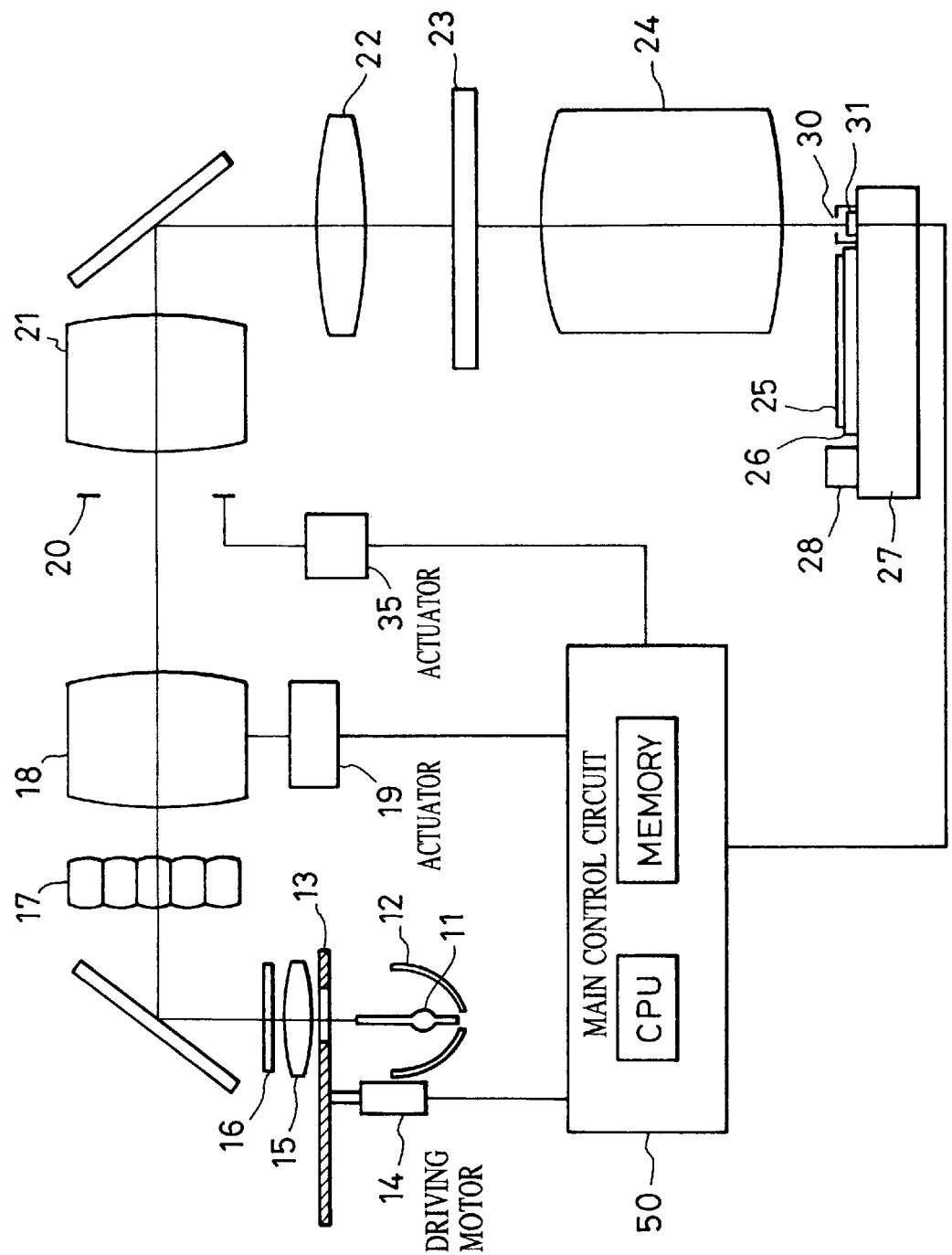
FIG. 1 is a schematic view illustrating an exposure apparatus, according to an embodiment of the present invention, when performing a first measurement.

FIG. 1 shows a general view of a projection exposure apparatus, in which only exposure-related portions according to the present invention are illustrated.

The projection exposure apparatus includes an extra-high pressure mercury lamp 11 serving as a light source, an elliptical mirror 12 for converging light from lamp 11, a shutter 13, a driving motor 14 for driving the shutter 13, a condenser lens 15, a wavelength selection filter 16, an optical integrator 17, a mirror between the filter 16 and the integrator 17 for reflecting light from lamp 11 and mirror 12, having passed through shutter 13, lens 15 and filter 16, to the integrator 17, and condenser lenses 18 (only one being shown, as representative) for converging light outputted from the optical integrator 17. The condenser lenses 18 can control an illuminance distribution on a reticle 23 or a wafer 25 by changing lens intervals. The position of a masking blade 20 can be adjusted so that only a predetermined portion on the reticle 23 is illuminated. For this purpose, the masking blade 20 is disposed on a conjugate surface with respect to the reticle 23. An actuator 35 drives the masking blade 20. Exposure light from the masking blade 20 passes through condenser lens 21, is reflected by a mirror, and passes through condenser lens 22 to illuminate the reticle 23. An illuminated pattern on the reticle 23 is converged by a projection optical system 24 to form an image on the wafer 25, which is held by a wafer chuck 26. The following elements constitute the illumination system: lamp 11, mirror 12, shutter 13, lens 15, filter 16, integrator 17, the mirror between filter 16 and integrator 17, lens 18, blade 20, lenses 21 and 22, and the mirror between lenses 21 and 22.

A main-control circuit 50 controls a driving system including the driving motor 14, the actuators 19 and 35, and performs various types of operations. When the illuminance is measured, an output signal from a photoelectric detection system is inputted to the main-control circuit 50, and based on the calculated illuminance distribution calculated by the main-control circuit 50, the circuit 50 controls a predetermined driving system to provide uniform illuminance distribution. For this purpose the main-control circuit 50 includes operation circuits such as a central processing unit (CPU) and a memory.

Conventionally, uniformity of illuminance by the exposure apparatus is verified by the photoelectric detection system mounted on a wafer stage 27 with the reticle 23 removed and with the masking blade 20 completely open. The photoelectric detection system has a pinhole 30 of approximately 0.5 mm diameter and is the same height as the wafer 25, and a photodetector 31 disposed under the pinhole 30. The photoelectric detection system detects exposure light having passed through the pinhole 30 with the photodetector 31. The photoelectric detection system measures each point on an exposed region while being moved. The photoelectric detection system is initialized to set an error in illuminance distribution, obtained from measured results, to ±1% or less.

However, a real reticle has a reflectance of approximately 10% if the reticle is comprised of three layers, and has a reflectance of as much as 60% if the reticle is comprised of two layers. The reflected light from the reticle travels through the illumination system, and is reflected by an element or elements of the illumination system and travels back through the illumination system to the reticle, and thus, the illuminance distribution at the location of the reticle when the reticle is absent is different from a value measured on the reticle.

In this embodiment, the illuminance distribution is measured twice, with the real reticle mounted in the apparatus. Thereby, ghost light caused by the reflected light is measured, and the illumination system is adjusted based on the measured result to eliminate the influence of the ghost light. In connection with this process, as a standard condition, the illuminance distribution without the reticle 23 must be adjusted within a predetermined tolerance of, for example, ±1%.

First measurement is performed with the masking blade 20 open to the practical exposing condition after the reticle 23 is mounted to the apparatus. In other words, the measurement is performed under the same condition as when the wafer 25 is actually exposed. Consequently, in this condition, reflected light from the reticle 23 returns to the illumination system, and is reflected as ghost light to the reticle 23. The measurement is performed at a plurality of points on the exposed region, for example, it is done in the form of a matrix. The positions of the measured points are accurately measured by a laser length measuring machine (not shown) using a mirror 28, and the measured values are stored.

In the measurement of illuminance according to the present invention it should be noted that, since the measurement is performed using the pattern formed on the reticle 23, measured values are affected by the transmission condition caused by the pattern itself. This can be also applied to a second measurement operation, which will be described below.

Figure 2:
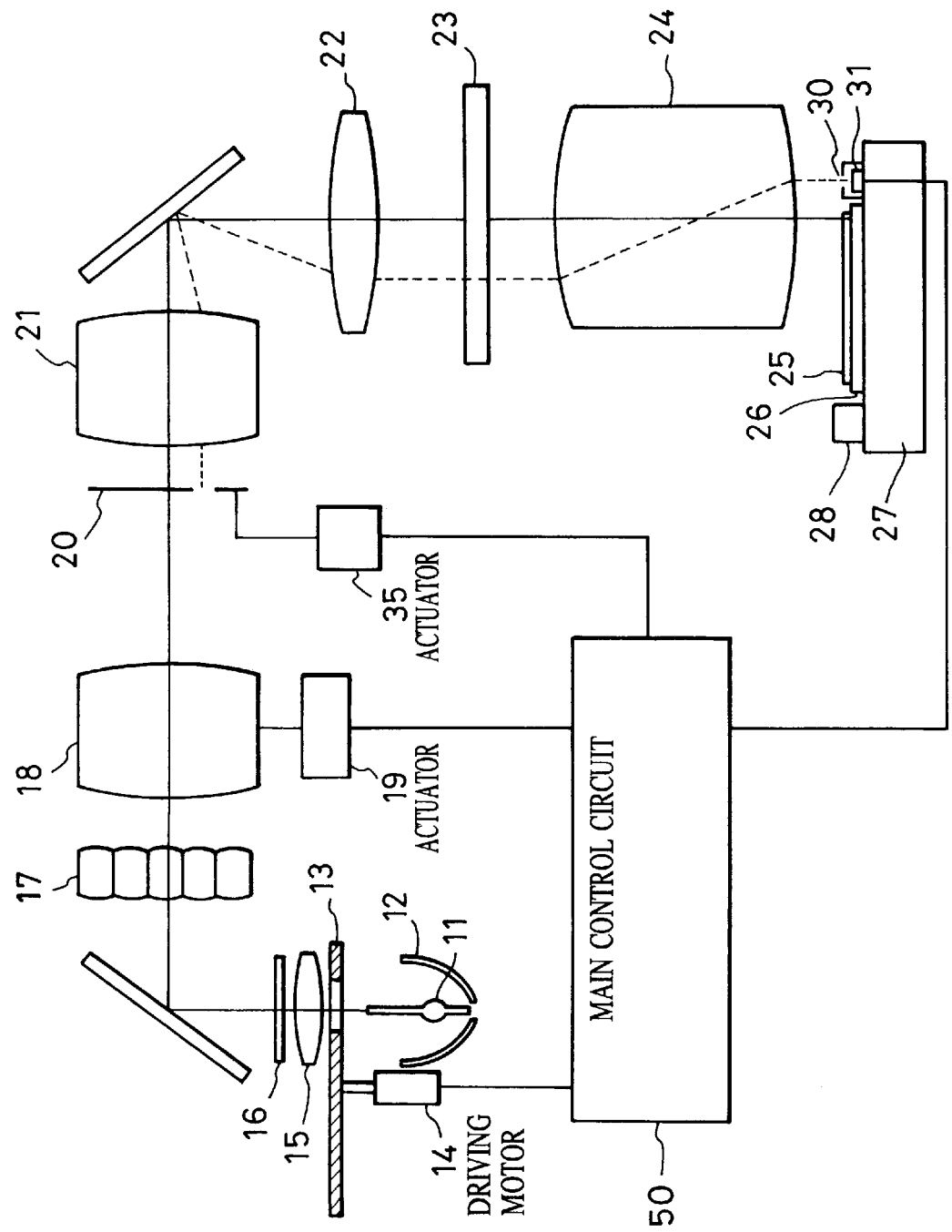
FIG. 2 is a schematic view illustrating the exposure apparatus, according to the embodiment of the present invention, when performing a second measurement.
Figure 3:
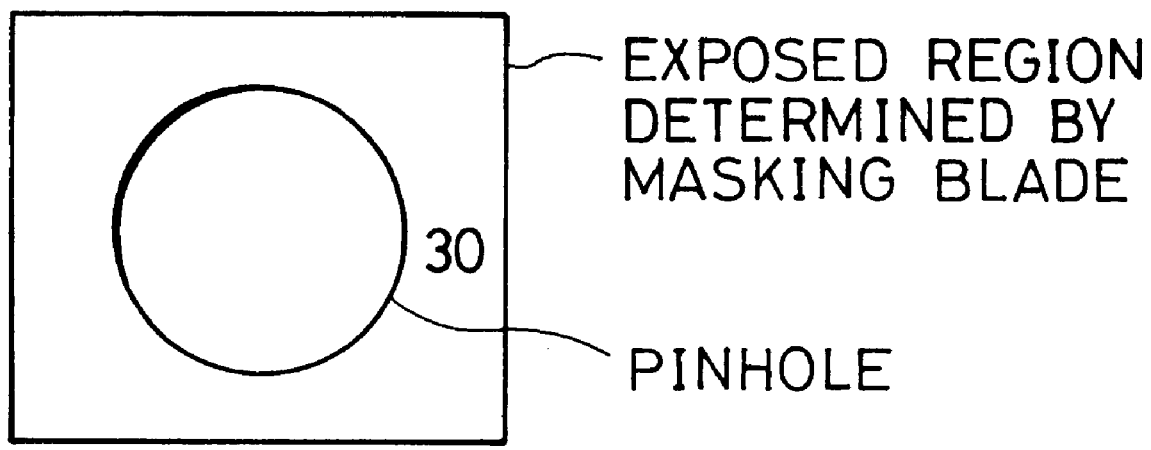
FIG. 3 is an illustration showing the relationship between a pinhole and a region determined by a masking blade, in the second measurement.

The second measurement follows the first measurement. The second measurement is shown in FIG. 2. In the second measurement, the reticle 23 is maintained in the same condition as in the first measurement. In other words, the second measurement can be performed successively with respect to the first measurement. According to the second measurement, the masking blade 20 is stopped further down so that only a portion of the wafer stage 27, the portion at which the photoelectric detection system is positioned, is illuminated. The relationship between the pinhole 30 and the illuminated region determined by the masking blade 20 is shown in FIG. 3. The illuminated region is slightly larger than the diameter of the pinhole 30. For example, the region can be formed by stopping down the masking blade 20 at the diameter of the pinhole 30 to 0.5 mm so as to form a square or rectangle of illumination having one side of 1 to 5 mm on the wafer. In order to measure the illuminance distribution in the exposed region, the wafer stage 27 is moved to each measurement point, and the position of the opening of the masking blade 20 also changes so that the illuminated region moves corresponding to the measurement point.

Figure 4:
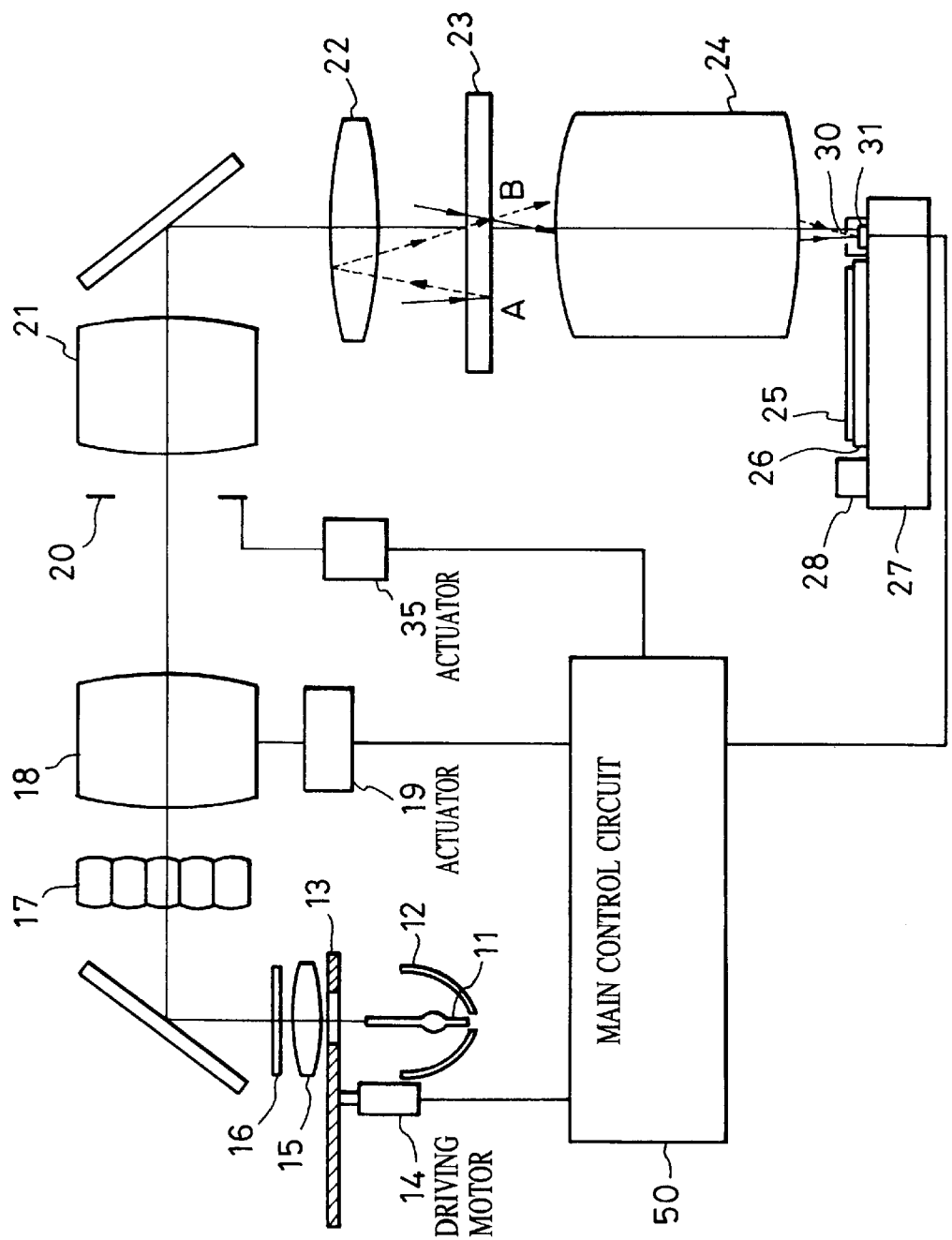
FIG. 4 is a schematic view illustrating how a ghost image occurs due to light reflected by a reticle.

As shown in FIG. 4, ghost light is a phenomenon in which light incident upon a position A on the reticle 23 is reflected thereby to return to the illumination system, and is further reflected by an optical device in the illumination system (lens 22 in FIG. 4) to be incident upon a position B on the reticle 23, which is shifted from the original incident position. In FIG. 4, solid lines represent light which normally illuminates the reticle 23, and dotted lines represent ghost light. The reticle 23 has a circuit pattern thereon, composed of a material such as chromium or chromium oxide. The intensity of light reflected by the circuit pattern is dependent upon the circuit pattern, thus, reticles with different circuit patterns have different values of intensity. In the second measurement, only the periphery of the measurement point is illuminated with the exposure light. Thus, for example, while measurement is being performed with respect to a position corresponding to the position B, there is no possibility for reflected light caused by light incident upon the position A to be incident again upon the position B. In other words, this corresponds to measurement for a condition in which no ghost light occurs. The position of the photoelectric detection system under this measuring condition is monitored by a laser interferometer (not shown). The position of the measurement point in the second measurement can agree with the position of the measurement point in the first measurement to a precision of 0.1 µm or less. Consequently, the two measured values can be accurately compared at the same corresponding measurement point. When the ghost is completely eliminated, both measured values are equal.

Here the illuminance distribution in the exposed region (region to be measured) is measured at points arranged in a matrix of m×n. A measured value measured at each point during the first measurement is represented by $a_1(m, n)$, a measured value measured at each point during the second measurement is represented by $a_2(m, n)$, and a reference position is set at a predetermined position (p, q) in proximity to the center of the region to be measured. The reason why the reference position is set at the predetermined position (p, q) in proximity to the center is that, since the real reticle having a circuit pattern formed thereon is measured, the measured value becomes zero when the center is covered with chromium. Accordingly, the predetermined position (p, q) is selected from positions in proximity to the center, which measure not zero but which have measured values no less than a certain amount (for example, 30% or greater of a maximum measured value among values at all the measurement points). After measurement of the illuminance distribution on the wafer, $$a_1(m, n)/a_1(p, q)$$

with respect to the first measurement, and $$a_2(m, n)/a_2(p, q)$$

with respect to the second measurement are calculated. Both calculated results should be equal when no ghost light occurs at the same measurement point. However, both results are actually not equal due to the ghost light caused by the reflected light from the reticle 23. Accordingly, the ghost light is represented by the following value obtained by dividing the measured value in the first measurement by the measured value in the second measurement, as follows:

$$b(m, n) = \{a_1(m, n) \cdot a_2(p, q)\} / \{a_1(p, q) \cdot a_2(m, n)\}$$

In this case, to prevent the measured value measured during the first measurement from being divided by zero, the calculation is performed with respect to (m, n) when $a_2(m, n) \neq 0$, and $b(m, n) = 0$ with respect to (m, n) when $a_2(m, n) = 0$. The value of $b(m, n)$ excluding the term set to zero is 1 when no ghost light is present. A shift in $b(m, n)$ away from 1 represents the distribution of the ghost light. For simplification, assuming that four outermost points (1, 1), (1, n), (m, 1) and (m, n) have values except for zero, the following expression $$\{b(1, 1) + b(1, n) + b(m, 1) + b(m, n)\}/4$$

is related to an increase or decrease in the quantity of light in the periphery. With this operation, the distribution of the ghost light can be two-dimensionally obtained, so that a concentric square distribution and a linear distribution can be obtained. For example, in the calculation of a linear distribution, the following expression $$\{b(1, 1)+b(1, n)-b(m, 1)-b(m, n)\}/2$$

represents a laterally changing illuminance distribution, while the following expression $$\{b(1, 1)-b(1, n)+b(m,1)-b(m, n)\}/2$$

represents a longitudinally changing illuminance distribution.

In this embodiment an example of the calculation at four corners has been described. However, in practice, by averaging the distribution in a region having a certain extent, the value of the ghost light may be found. This is because the ghost light itself is not light which converges to form an image on the reticle or the wafer, and thus, it has a gradual distribution on the reticle. For example, when measurement is performed at 225 points formed by m=n=15, the region to be measured is divided into 5×5=25 blocks by regarding adjacent 3×3=9 points as one block, and measured values in each block are averaged to find the distribution of the ghost light.

In addition, to uniformly illuminate the reticle 23, correction for the measured ghost light will be described.

Figure 10:
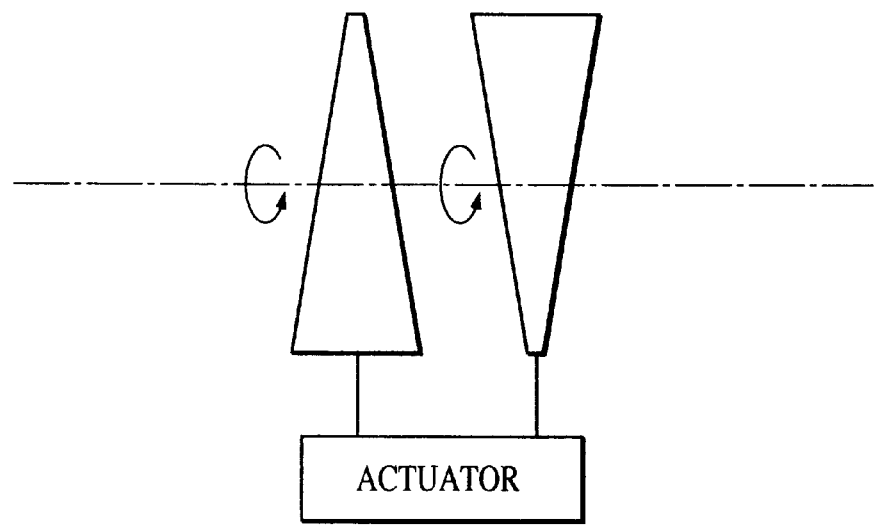
FIG. 10 is a schematic chart illustrating deflection-angle-variable wedge-shaped prisms.
Figure 11:
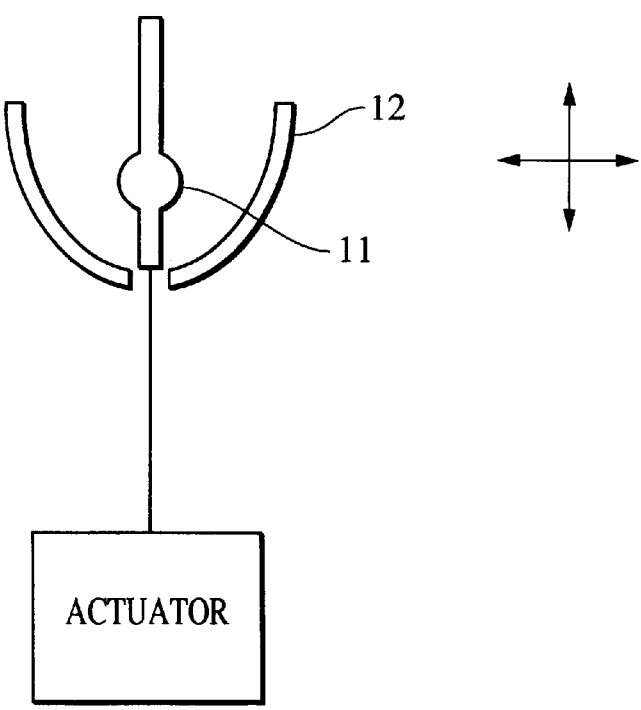
FIG. 11 is a schematic chart illustrating means for adjusting the position of an extra-high pressure mercury lamp.

With respect to a concentric square illuminance distribution, correction can be performed by, for example, adjusting intervals between lenses included in the condenser lenses 18 with the actuator 19 so that the mask 23 is uniformly illuminated. With respect to a linearly changing illuminance distribution, correction can be performed by, for example, using a deflection-angle-variable wedge (shown in FIG. 10) formed by a combination of two rotatable wedges disposed before the optical integrator 17, or by adjusting the position of the extra-high pressure mercury lamp 11 in the vertical direction with respect to the optical axis of the illuminating optical system (shown in FIG. 11) so that the reticle 23 is uniformly illuminated.

Figure 5:
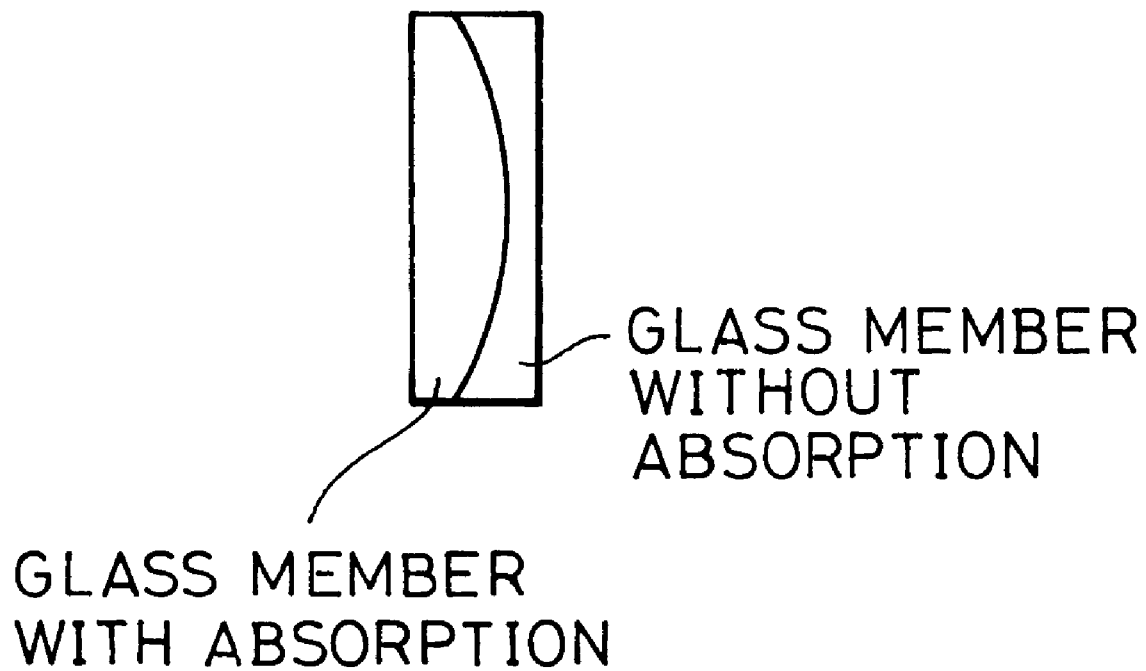
FIG. 5 is a cross-sectional view illustrating an absorbent filter comprised of two glass members.
Figure 6:
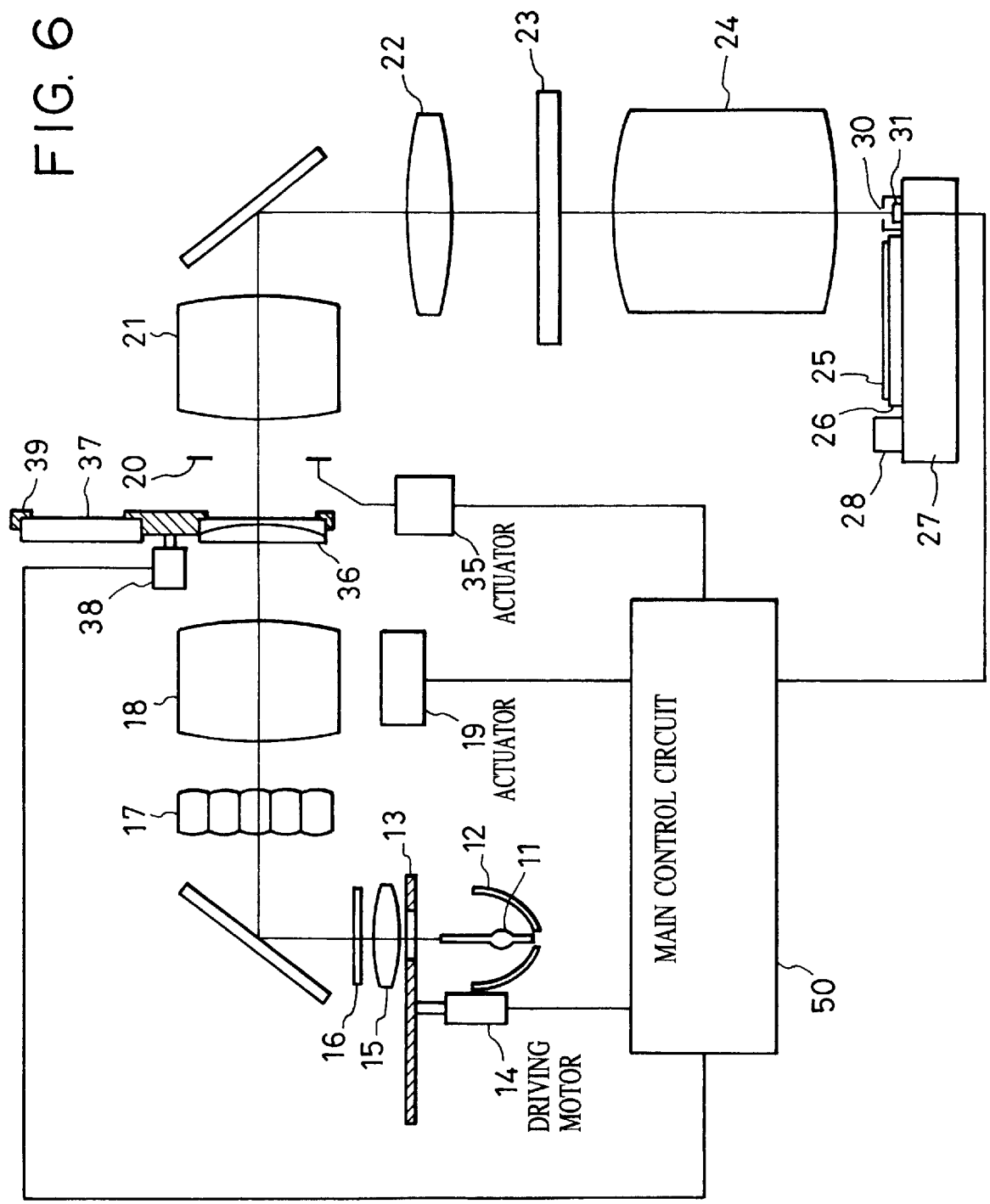
FIG. 6 is a schematic view illustrating an example in which the absorbent filter shown in FIG. 5 is disposed in an exposure apparatus of the present invention.

Otherwise, it possible to use methods for correction of the illuminance distribution by inserting a filter in the optical path of the exposure light. As filters to correct the concentric square distribution, there are types such as a reflective filter inserted just behind the optical integrator 17, which has a multilayer film with a lower transmittance to obliquely incident light than to vertically incident light, and an absorbent filter in which a convex glass member with a high transmittance and no light absorption and a concave glass member with light absorption are cemented together as shown in FIG. 5. The glass member with light absorption causes a concentric illuminance distribution. FIG. 6 shows an embodiment identical to that shown in FIG. 1 except that it permits exchanging various filters disposed in proximity to the masking blade 20 in accordance with the condition of the ghost light. The apparatus includes the absorbent filter 36 shown in FIG. 5, a reference filter 37 composed of the glass member with no light absorption of filter 36, which is inserted under the normal conditions, and a motor 38 for rotating a turret 39 provided with various filters.

Figure 7:
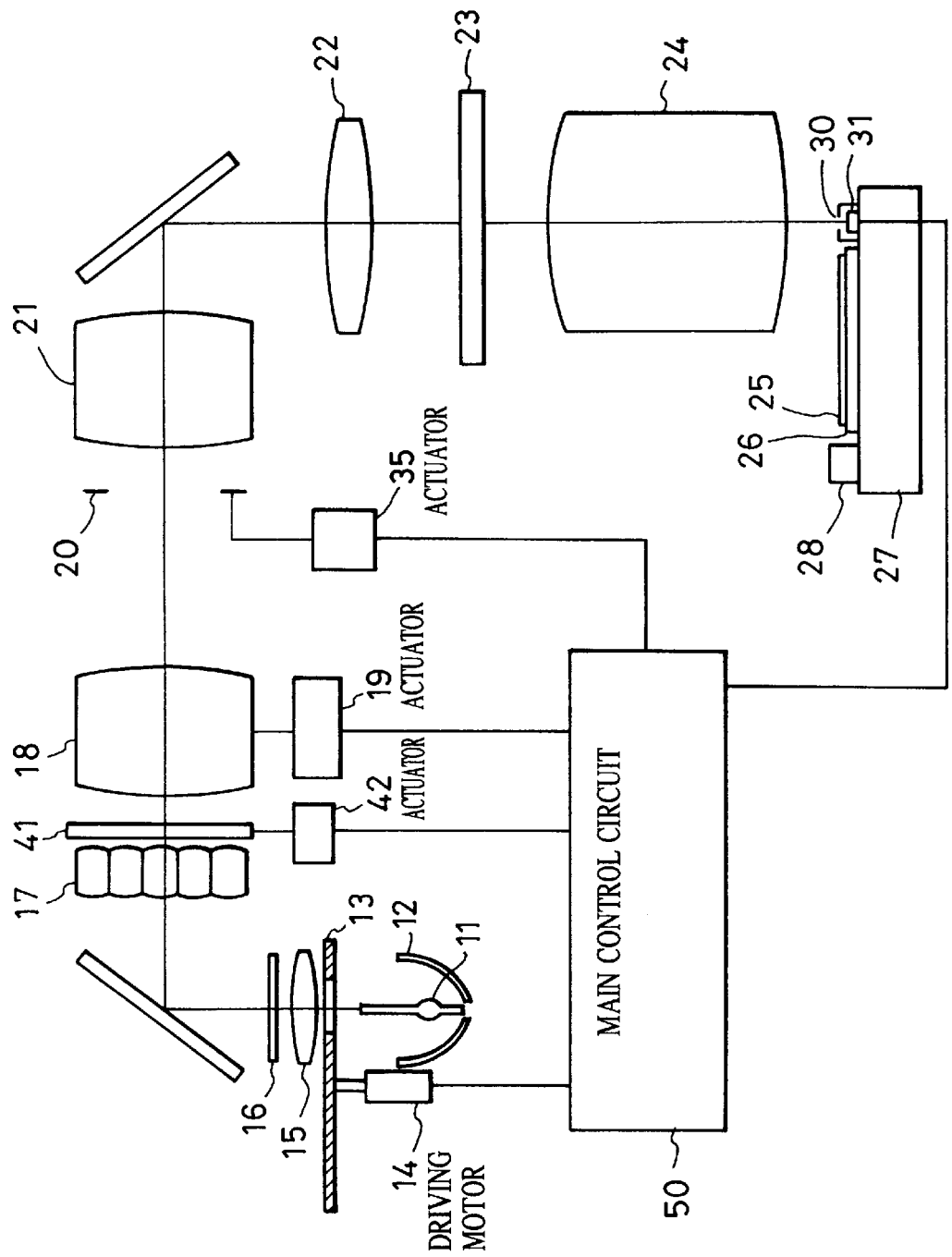
FIG. 7 is a schematic view illustrating an example in which a reflective filter for correcting an illuminance distribution, expressed as a linear inclination, is disposed in an exposure apparatus of the present invention.

In addition, regarding the linearly changing illuminance distribution, correction can be performed by slightly inclining the above-mentioned reflective filter (inserted just behind the optical integrator 17) with respect to the optical axis of the illuminating optical system. FIG. 7 shows an embodiment identical to that shown in FIG. 1 except that it includes a reflective filter 41 having the multilayer film disposed behind the optical integrator 17. The reflective filter 41 has the same structure as the reflective filter disposed in connection with FIGS. 5 and 6. The filter 41 is inclined by an actuator 42 based on the measured values measured during the first and second measurement. The inclination is minute, which does not particularly affect other performance characteristics of the optical system, such as shifting of the optical axis. Accordingly, the reticle 23 is uniformly illuminated so the ghost light is compensated for.

Data representing the illuminance distribution of the ghost light in the illuminating optical system, measured by the measuring method in this embodiment, can be stored in a file and can be used as the basis for a driving command value for actuators 19, 35, and/or 42 for adjusting the illuminance so that the reticle 23 is uniformly illuminated. Therefore, concerning the reticle on which ghost light has been measured, measurement does not need to be done whenever a reticle is mounted on the exposure apparatus. Instead, the stored value is read in the apparatus, and the condition of the illumination system can be determined based on the read value to correct for the ghost light. Thus, with the condition (distribution) of the ghost light stored, the illumination system may be activated based on the stored value. Also, since the occurrence conditions of the ghost light may be different in each exposure apparatus, the stored ghost light data may be treated not only with respect to the reticle itself but also as a characteristic parameter of the apparatus.

An embodiment of a method for manufacturing semiconductor devices, utilizing the exposure apparatus shown in FIG. 1, will be described.

Figure 8:
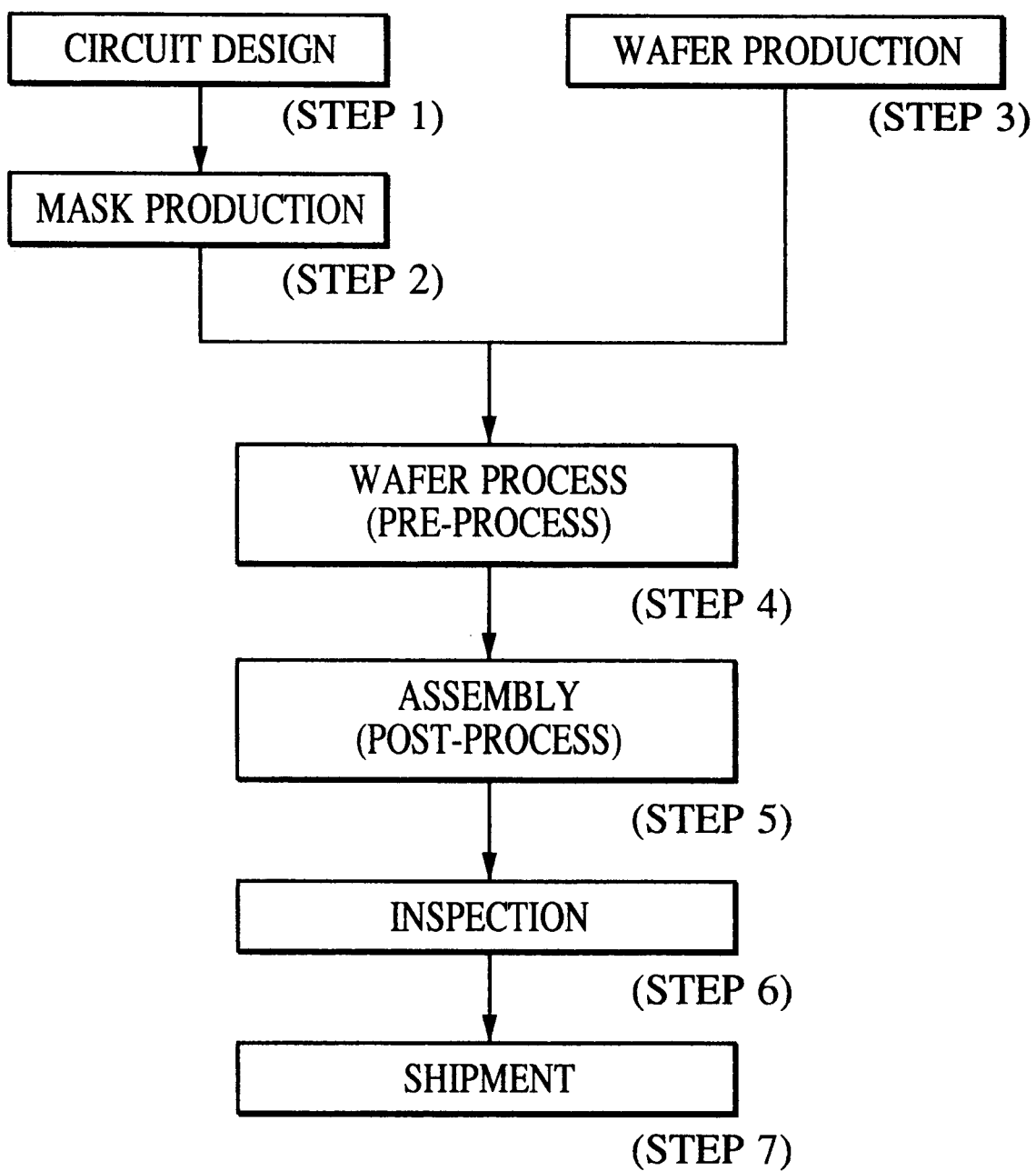
FIG. 8 is a flowchart showing a process for manufacturing semiconductor devices.

FIG. 8 shows a flowchart for manufacturing semiconductor devices (semiconductor chips such as integrated circuits and large-scale integrated circuits, liquid crystal panels, and charge-coupled devices). In step 1 (circuit design) the circuit of a semiconductor device is designed. In step 2 (mask production) a mask on which the designed circuit pattern is formed is produced. Also, in step 3 (wafer production) a wafer (wafer 25) is produced using a material such as silicon. In step 4 (wafer process) which is called a pre-process, a circuit is actually formed on the wafer using the mask and the wafer by lithographic techniques. In successive step 5 (assembly) which is called a post-process, a chip is assembled using the wafer produced in step 4, and this step includes an assembly process (dicing, bonding), a packaging process (chip sealing), and another process. In step 6 (inspection) the assembled semiconductor chip is tested to verify its operation, durability and another characteristic. Through the foregoing steps the semiconductor chip is completed, and is shipped (in step 7).

Figure 9:
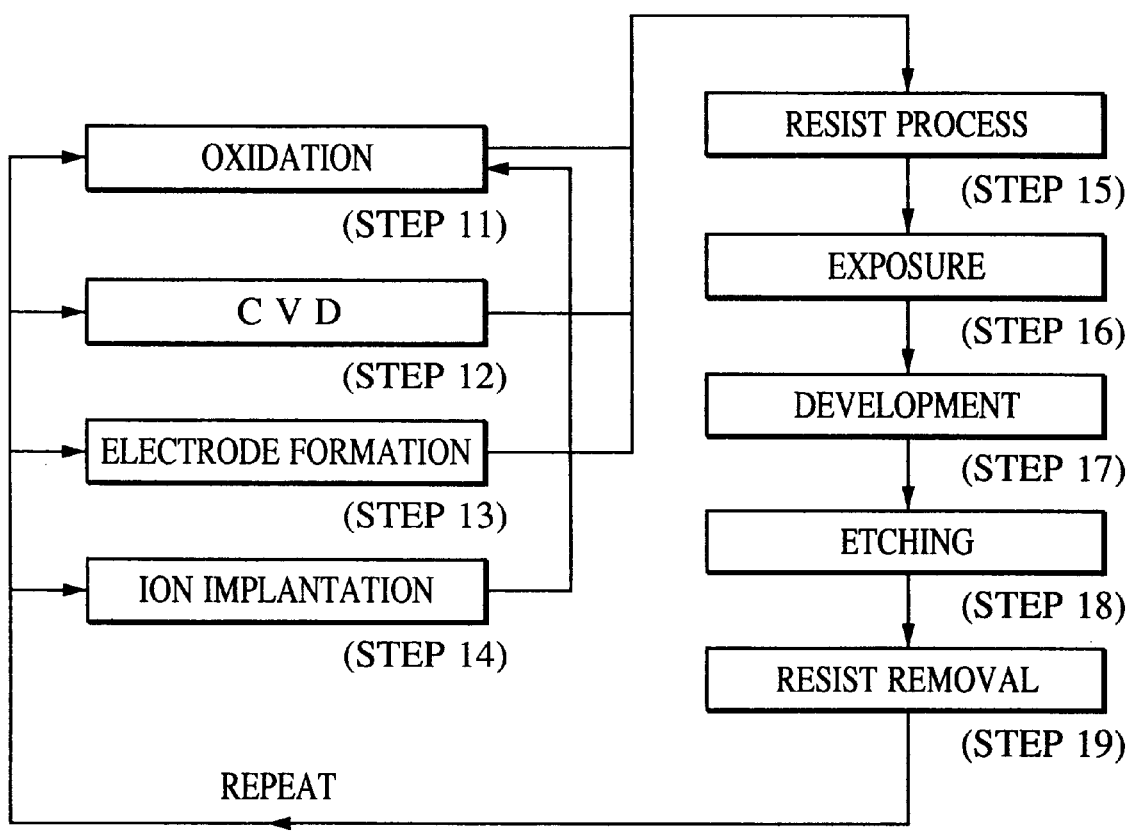
FIG. 9 is a flowchart showing details of a wafer process in the manufacturing process shown in FIG. 8.

FIG. 9 shows a detailed flowchart of the above wafer process (step 4). In step 11 (oxidation) a surface of the wafer (the wafer 25) is oxidized. In step 12 (chemical vapor deposition (CVD)) an insulating layer is formed on the surface of the wafer. In step 13 (electrode formation) electrodes are formed on the wafer by vapor deposition. In step 14 (ion implantation) ions are implanted into the wafer. In step 15 (resist process) the wafer is coated with resist (photosensitive material). In step 16 (exposure) the wafer is exposed with the image of the circuit pattern of the mask (reticle 23) by the exposure apparatus. In step 17 (development) the exposed wafer is developed. In step 18 (etching) the wafer surface which has not been developed is etched. In step 19 (resist removal) the unnecessary resist after etching is removed. By repeating these steps, the circuit pattern is formed on the wafer.

The use of the method for manufacturing semiconductor devices according to this embodiment enables the manufacture of highly integrated semiconductor devices, which has conventionally been difficult.

What is claimed is:

1. An illuminance measuring method for measuring the illuminance on a wafer in an exposure apparatus for projecting a pattern formed on a mask onto the wafer, the illuminance of the mask causing the formation of ghost light on the mask, the method comprising the steps of:

using a first technique, including using a measuring device, to measure the illuminance on the wafer while the mask, having the pattern formed thereon, is mounted in the exposure apparatus and the mask is illuminated, wherein the first technique includes measuring ghost light;

using a second technique, different from the first technique and performed successively with respect to the first technique, to measure, using the measuring device, the illuminance on the wafer while the mask, having the pattern formed thereon, is mounted in the exposure apparatus and the mask is illuminated, wherein the second technique does not include measuring ghost light; and finding the distribution of the ghost light, based on the illuminance measured by the first and second techniques.

2. An illuminance measuring method according to claim 1, further comprising the step of determining the distribution of the ghost light by comparing illuminance values measured at the same point by the first and second techniques.

3. An illuminance measuring method according to claim 1, wherein said first technique using step includes the step of measuring the illuminance at a portion of the wafer while the overall pattern formed on the mask is being illuminated, and wherein said second technique using step includes the step of measuring the illuminance while only the region in proximity to the portion being measured is illuminated.

4. An illuminance measuring method for measuring the illuminance on a wafer in an exposure apparatus for projecting a pattern formed on a mask onto the wafer, the illuminance of the mask causing the formation of ghost light on the mask, the method comprising the steps of:

measuring, in a first measuring step, the illuminance on the wafer, using a measuring device, while the mask, having the pattern formed thereon, is mounted in the exposure apparatus, when the measured illuminance on the wafer includes the ghost light;

measuring, in a second measuring step, the illuminance on the wafer, using the measuring device, while the mask, having the pattern formed thereon, is mounted in the exposure apparatus, when the measured illuminance on the wafer does not include the ghost light; and finding the distribution of the ghost light by comparing the illuminance measured by said first and second measuring steps.

5. An illuminance measuring method according to claim 4, wherein said first measuring step is performed at a portion of the wafer while the overall pattern formed on the mask is being illuminated, and wherein said second measuring step is performed on the portion of the wafer while only the region in proximity to the portion being measured is illuminated.

6. An exposure apparatus including:

a mask stage for supporting a mask having a pattern formed thereon;

a wafer stage for supporting a wafer onto which the pattern formed on the mask is projected;

illuminance measuring means for measuring the illuminance on the wafer; and operation means for determining the distribution of ghost light caused by the mask, having the pattern formed thereon, when the mask is illuminated in said exposure apparatus, wherein said illuminance measuring means uses a plurality of successive techniques to measure the illuminance on the wafer while the mask, having the pattern formed thereon, is mounted on said mask stage, and wherein said operation means determines the distribution of the ghost light based on the illuminance measured by the plurality of successive techniques used by said illuminance measuring means.

7. An exposure apparatus according to claim 6, wherein said operation means determines the distribution of the ghost light by comparing the illuminance measured at the same measuring point by the plurality of techniques by said illuminance measuring means.

8. An exposure apparatus according to claim 6, wherein the plurality of techniques used by said illuminance measuring means includes a technique for measuring the illuminance at a portion of the wafer while the overall pattern formed on the mask is being illuminated, and a technique for measuring the illuminance at the portion of the wafer while only a region in proximity to the portion being measured is illuminated.

9. An exposure apparatus according to claim 6, further including means for adjusting the illuminance distribution by using the determined distribution of the ghost light so that the mask is uniformly illuminated.

10. An exposure apparatus according to claim 9, wherein said means for adjusting the illuminance distribution includes means for changing intervals between lenses included in an illumination system for illuminating the mask and the wafer.

11. An exposure apparatus according to claim 9, wherein said means for adjusting the illuminance distribution includes a plurality of rotatable wedge-shaped prisms disposed in an illumination system for illuminating the mask and the wafer.

12. An exposure apparatus according to claim 9, wherein said means for adjusting the illuminance distribution includes means for changing the portion of a light source for illuminating the mask and the wafer.

13. An exposure apparatus according to claim 9, wherein said means for adjusting the illuminance distribution includes at least one filter to be inserted in an optical path of an illumination system for illuminating the mask and the wafer.

14. An exposure apparatus according to claim 13, wherein said at least one filter includes a reflective filter having a multilayer film in which transmittance is lower with respect to obliquely incident light than with respect to vertically incident light.

15. An exposure apparatus according to claim 13, wherein said at least one filter includes an absorbent filter formed by cementing first and second optical members, the first optical member having high transmittance and absorbing no light, and the second optical member absorbing light.

16. An exposure apparatus according to claim 13, further including means for exchanging said filters.

17. An exposure apparatus according to claim 9, said exposure apparatus accommodating different masks, said apparatus further including means for storing data representing an amount of adjustment of the illuminance distribution based on the distribution of the ghost light caused by each mask having the pattern formed thereon to be used in said exposure apparatus by said means for adjusting the illuminance distribution.

18. An exposure apparatus according to claim 17, wherein said means for adjusting the illuminance distribution automatically adjusts the illuminance distribution based on the stored amount of adjustment.

19. An exposure apparatus according to claim 9, further including means for storing data representing the distribution of the ghost light corresponding to each mask to be used in said exposure apparatus.

20. An exposure apparatus according to claim 19, wherein said means for adjusting the illuminance distribution automatically adjusts the illuminance distribution based on the stored data representing the distribution of the ghost light so that the mask is uniformly illuminate.

21. An exposure apparatus including:
    a mask stage for supporting a mask having a pattern formed thereon;
    a wafer stage for supporting a wafer onto which the pattern formed on the mask is projected;
    illuminance measuring means for measuring the illuminance on the wafer; and
    operation means for determining the distribution of ghost light caused by the mask, having the pattern formed thereon, when the mask is illuminated in the exposure apparatus,
    wherein said illuminance measuring means successively measures the illuminance on the wafer when the illuminance measured on the wafer includes ghost light and when the illuminance measured on the wafer does not include the ghost light while the mask, having the pattern formed thereon, is mounted in said exposure apparatus, and
    wherein said operation means determines the distribution of the ghost light by comparing the measured illuminance when the measured illuminance on the wafer includes and does not include the ghost light.

22. An exposure apparatus according to claim 21, wherein said illuminance measuring means measures the illuminance including the ghost light at a portion of the wafer while the overall pattern formed on the mask is being illuminated, and wherein said illuminance measuring means measures the illuminance not including the ghost light at the portion of the wafer while only the region in proximity to the portion of the wafer where the illuminance is measured is illuminated.

23. An exposure apparatus according to claim 21, further including means for adjusting the illuminance distribution so that the mask is uniformly illuminated.

24. An exposure apparatus according to claim 23, wherein said means for adjusting the illuminance distribution includes means for changing intervals between lenses included in an illumination system for illuminating the mask and the wafer.

25. An exposure apparatus according to claim 23, wherein said means for adjusting the illuminance distribution includes a plurality of rotatable wedge-shaped prisms disposed in an illumination system for illuminating the mask and the wafer.

26. An exposure apparatus according to claim 23, wherein said means for adjusting the illuminance distribution includes means for changing the position of a light source of an illumination system for illuminating the mask and the wafer.

27. An exposure apparatus according to claim 23, wherein said means for adjusting the illuminance distribution includes at least one filter to be inserted in an optical path of an illumination system for illuminating the mask and the wafer.

28. An exposure apparatus according to claim 27, wherein said at least one filter includes a reflective filter having a multilayer film in which transmittance is lower with respect to obliquely incident light than with respect to vertically incident light.

29. An exposure apparatus according to claim 27, wherein said at least one filter includes an absorbent filter formed by cementing first and second optical members, the first optical member having high transmittance and absorbing no light, and the second optical member absorbing light.

30. An exposure apparatus according to claim 27, further including means for exchanging said filters.

31. An exposure apparatus according to claim 23, wherein said mask stage can support different masks to be used in the exposure apparatus, said apparatus further including means for storing data representing an amount of adjustment of the illuminance distribution determined based on the distribution of the ghost light caused by each mask, having a pattern formed thereon, to be used in said exposure apparatus by said means for adjusting the illuminance distribution.

32. An exposure apparatus according to claim 31, wherein said means for adjusting the illuminance distribution automatically adjusts the illuminance distribution based on the stored amount of adjustment.

33. An exposure apparatus according to claim 23, wherein said mask stage can support different masks each having a pattern formed thereon to be used in said exposure apparatus, said exposure apparatus further including means for storing data representing the distribution of the ghost light corresponding to each mask to be used in said exposure apparatus.

34. An exposure apparatus according to claim 33, wherein said means for adjusting the illuminance distribution automatically adjusts the illuminance distribution based on the stored data representing the distribution of the ghost light so that the mask is uniformly illuminated.

35. A device manufacturing method for manufacturing devices using an exposure apparatus for projecting a pattern formed on a mask onto a wafer, the illuminance of the mask causing the formation of ghost light on the mask, said device manufacturing method comprising the steps of:
    using a first technique, including using a measuring device, to measure the illuminance on the wafer while the mask, having the pattern formed thereon, is mounted in the exposure apparatus, wherein the first technique includes measuring ghost light;
    using a second technique, different from the first technique and performed successively with respect to the first technique, to measure, using the measuring device, the illuminance on the wafer while the mask, having the pattern formed thereon, is mounted in the exposure apparatus, wherein the second technique does not include measuring ghost light;
    determining the distribution of the ghost light, based on the illuminance measured by the first and second techniques, and compensating for the ghost light using the distribution determined in said determining step to uniformly illuminate the mask; and
    projecting the pattern onto the wafer using the exposure apparatus to manufacture a device using the exposure apparatus.

36. A device manufacturing method according to claim 35, wherein the step of determining the distribution of the ghost light comprises the step of comparing the illuminance measured at the same measuring point by the first and second techniques.

37. A device manufacturing method according to claim 35, wherein said first technique using step includes the step of measuring the illuminance at a portion of the wafer while the overall pattern formed on the mask is being illuminated, and wherein said second technique using step includes the step of measuring the illuminance at the portion of the wafer while only the region in proximity to the portion being measured is illuminated.

38. A device manufacturing method for manufacturing devices using an exposure apparatus for projecting a pattern formed on a mask onto a wafer, the illuminance of the mask causing the formation of ghost light on the mask, said device manufacturing method comprising the steps of:

measuring, in a first measuring step, the illuminance on the wafer while the mask, having the pattern formed thereon, is mounted in the exposure apparatus, when the measured illuminance on the wafer includes ghost light;

measuring, in a second measuring step, the illuminance on the wafer, using the measuring device, while the mask used for actual exposure, having the pattern formed thereon, is mounted in the exposure apparatus, when the measured illuminance on the wafer does not include ghost light; and determining the distribution of the ghost light by comparing the illuminance measured by said first and second measuring steps, and compensating for the ghost light determined in said determining step to uniformly illuminate the mask; and projecting the pattern from the mask onto the wafer using the exposure apparatus to manufacture a device using the exposure apparatus.

39. A device manufacturing method according to claim 38, wherein said first measuring step is performed at a portion of the wafer while the overall pattern formed on the mask is being illuminated;

and wherein said second measuring step is performed on the portion of the wafer while only the region in proximity to the portion being measured is illuminated.

* * * * *